United States Patent [19]
Pützer

[11] 3,980,957
[45] Sept. 14, 1976

[54] CIRCUIT ARRANGEMENT FOR TUNING AND RANGE OR BAND SWITCHING OF AN RF RESONANT CIRCUIT

[75] Inventor: Walter Pützer, Krefeld, Germany

[73] Assignee: U.S. Philips Corporation, New York, N.Y.

[22] Filed: Mar. 14, 1975

[21] Appl. No.: 558,217

[30] Foreign Application Priority Data
Mar. 16, 1974 Germany............................ 2412689

[52] U.S. Cl.................................. 325/459; 334/15
[51] Int. Cl.².............................................. H04B 1/06
[58] Field of Search.......................... 325/458–459, 325/461–465, 452; 334/14–16, 56

[56] References Cited
UNITED STATES PATENTS

| | | |
|---|---|---|
| 3,611,154 | 10/1971 | Kupfer................................ 325/459 |
| 3,617,915 | 11/1971 | Amemiya et al.................. 334/15 X |
| 3,646,450 | 2/1972 | Ma...................................... 325/458 |
| 3,813,615 | 5/1974 | Okazaki........................... 334/15 X |
| 3,825,858 | 7/1974 | Amemiya et al.................. 334/15 X |
| 3,889,210 | 6/1975 | Matsuura et al.................. 334/15 X |

Primary Examiner—Robert L. Griffin
Assistant Examiner—Robert Hearn
Attorney, Agent, or Firm—Frank R. Trifari; Henry I. Steckler

[57] ABSTRACT

A television tuner features a switching voltage generator that resets the voltage across the varicap tuning diodes to about zero voltage when a new tuning range is switched on. This allows the full steepness of the capacitance-voltage characteristics of the diodes to be used in each range. This in turn allows more ranges to be tuned and reduces the effects of stray capacitances.

5 Claims, 8 Drawing Figures

CIRCUIT ARRANGEMENT FOR TUNING AND RANGE OR BAND SWITCHING OF AN RF RESONANT CIRCUIT

The invention relates to a circuit arrangement for tuning and range or band switching of an RF resonant circuit, for example, in a tuner of a television receiver, comprising a variable capacity diode which can be controlled by a tuning voltage for tuning the resonant circuit, and a switching diode controllable by a switching voltage and short-circuiting part of the resonant circuit inductance for switching over the wave-range, and a switching voltage generator controlled by the tuning voltage and generating the switching voltage for the switching diode.

The steps known so far for range or band switching in channel selector systems in television receivers are known from literature inter alia "Funkschau" 1972, No. 8, pages 249–252 and from the German published patent application No. 2,116,901. Such switching circuits are based on the following principle:

The tuner or tuners are arranged in such a manner that a division, for example, in the VHF range in band I and band III is effected from an aerial input in the initial stage. Subsequently separate amplifications in band I and in band III are effected, followed by a separate filtering until finally the signals are applied to the relevant mixer stages, and the IF signal for band III or band I can be derived from the output of these mixer stages or from the UHF tuner which is generally provided separately.

In the German published patent application No. 2,116,901 the above-mentioned range switching is obtained by satisfying the oscillation conditions, dependent on the tuning voltage, in different manners. It is true that this results in a separation, but in this case the RF preamplifier stages continue to operate and this may lead to unwanted modulation products due to strong interfering transmitters (for example, FM, mobilophone, etc.) possibly occurring in the intermediate ranges.

It is also known to switch over the preliminary stages, i.e., the RF resonant circuits present in these stages. It is also known to short-circuit the wave range coil, which is not necessary, by means of a switch. In the German published patent application No. 1,791,222 a circuit arrangement for tuning is described in which dependent on the tuning voltage the diodes which are connected in parallel with the resonant circuits, are switched in the pass direction at different voltage potentials of this tuning voltage so that the resonant circuits or the resonant circuit coils of the relevant wave range are short-circuited.

An electric resonant circuit with a resonant frequency which can be electronically changed over is known from German published patent application No. 2,134,466. Here the collector-emitter path of a transistor is connected with respect to the direct current in parallel with the diode and the transistor base is driven by a pulsatory voltage. A complete circuit for changing over a tuner for a television receiver is described in U.S. Pat. No. 3,646,450. Here an electronic change-over for the resonant circuits is described in principle, namely for the input amplifier circuit, the output amplifier circuit, the mixer circuit and the oscillatory circuit. All resonant circuits include a variable capacity tuning diode, further referred to as variable capacity diode. This variable capacity diode is connected through the resonant circuit coils to the common reference point on one side, thus for example in this case to ground. The other side of the variable capacity diode is connected to a tap on a potentiometer, which tap is connected to the tuning direct voltage. This tuning voltage may thus change from +2 to +30V. The known circuit is as follows:

The inductor of the resonant circuit is divided into two partial coils one of which is shunted by a switching diode. Also in this case, as described above, the switching diode is provided with the purpose of interconnecting this diode dependent on the tuning voltage and with the purpose of short-circuiting one waverange coil, i.e., one partial coil so that a waverange switching is realized. The essence of this U.S. Pat. No 3,646,450 is the circuit arrangement for switching these switching diodes. Their anodes are connected to a switching transistor which is cut off at low tuning voltages and for this reason all switching diodes are in the cut-off region at low tuning direct voltages. Only when a certain tuning voltage, for example, 13 V is reached does the switching transistor connect a positive voltage directly to the switching diodes which are switched in the pass region. The switching transistors in the direct current circuit are driven by a second transistor which may be referred to as driver transistor. This driver transistor is combined with another third transistor to a difference amplifier circuit and this in such a manner that for a very determined voltage threshold previously determined by resistors, i.e. at a very determined direct voltage which in turn means a very determined tuning voltage this threshold voltage is reached. When this threshold value is reached the above-mentioned third transistor which is normally driven at low tuning voltages in the pass region is cut off and the above-mentioned driver transistor is interconnected. The collector circuit of this transistor has a collector resistor located in the emitter-base circuit of the switching transistor. When a voltage drop occurs on this collector resistor, the switching transistor may suddenly be interconnected and thereby operate the switching diodes. The invention is principally based on this previously mentioned art, hence according to U.S. Pat. No. 3,646,450.

FIG. 2 of U.S. Pat. No. 3,646,450 shows, as described above, a change-over of the resonant circuits by short-circuiting partial inductors upon reaching a certain threshold value, that is to say, upon reaching a certain direct voltage value of the tuning voltage. However, this tuning voltage is always approximately equal to the voltage present at the variable capacity diodes. Therefore variable capacity diodes are driven in the lower frequency range or in the lower frequency band in a characteristic region which partially shows a large steepness, while the steepness in the upper frequency range is considerably smaller. This drawback is to be obviated.

In a switching circuit arrangement of the kind described above the invention provides a solution where the tuning diode voltage is reset to about zero voltage when a new tuning range is switched in. When using the invention the full steepness of the diodes may be utilized in each band or in each range which has considerable advantages because without this step the desired frequency bands or regions may not be tuned at all which the available variable capacity diode. In addition the switching capacity or the stray capacity present in each RF resonant circuit has a much lesser influence on the resonant circuit conditions.

Embodiments according to the invention are shown in the drawing and will be further described hereinafter.

Figure 1:
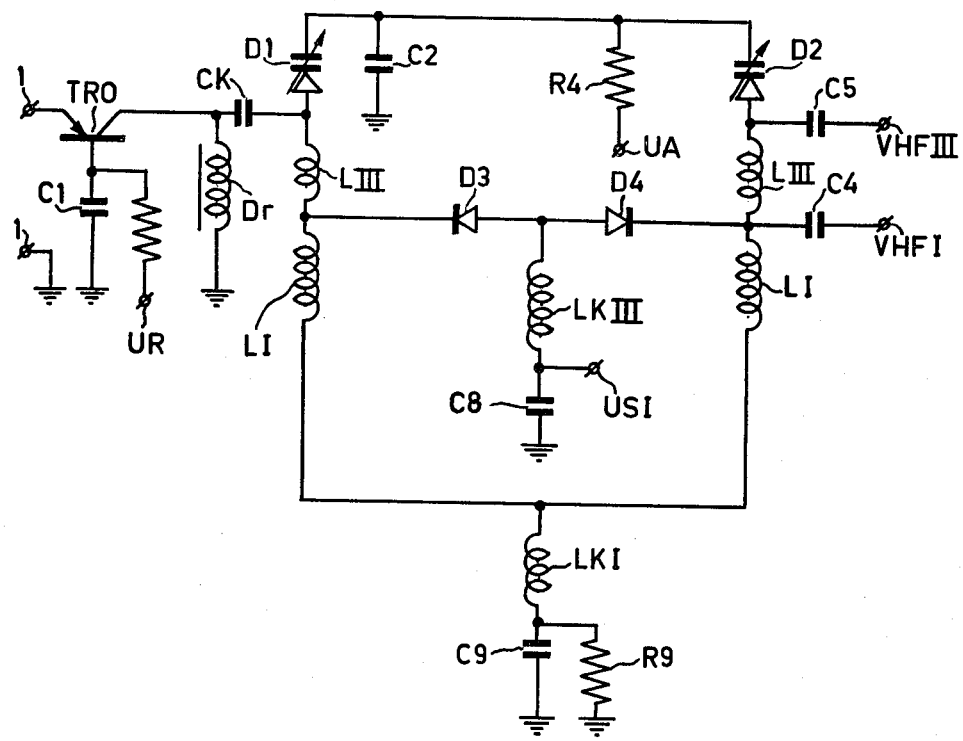
FIG. 1 shows a so-called base circuit for a VHF tuner according to the invention.

In FIG. 1 the reference TRO denotes the input transistor or the preliminary stage transistor in a VHF tuner of a television receiver. The input signal coming from the aerial and passing through an input filter is available at the terminals 1. The base of the transistor TRO is connected through C1, a relatively large capacitor of, for example, 1000 pF to the common reference point, in this case ground. A control voltage UR for automatic gain control is applied through a resistor to the transistor TRO. A choke Dr closes the collector direct current circuit relative to ground. The following RF resonant circuits are coupled through a capacitor CK to the input transistor TRO. They consist of inductors LI for band I and LIII for band III and of tuning diodes, i.e., variable capacity diodes D1 and D2 whose capacitances may be changed by the tuning voltage UA through a resistor R4 of approximately 39 kOhm. A capacitor C2 has a value of, for example, 1000 pF and connects one end of the variable capacity diodes D1 and D2 to ground. While coupling-in in these RF resonant circuits can take place through the capacitor CK which may be of the order of 2.2 pF, coupling-out is effected for the band I through a capacitor C4 of approximately 3.9 pF and in band III through a capacitor C5 of, for example, 1.5 pF. For changing of the bands two other diodes D3 and D4 are provided in the RF resonant circuit which are connected through a common coupling coil LKIII to a direct current connection USI and through the band coils LI and a common coupling coil LKI and a resistor R9 of, for example, 2.7 kOhm to ground.

When the diodes D3 and D4 are in the blocking region the band coils LI and LIII are jointly active and when tuning the variable capacity diodes D1 and D2 tuning is effected in the band I. On the other hand, with the diodes D3 and D4 in the pass region only the band coils LIII are active and tuning is effected in band III with the variable capacity diodes.

Figure 2:
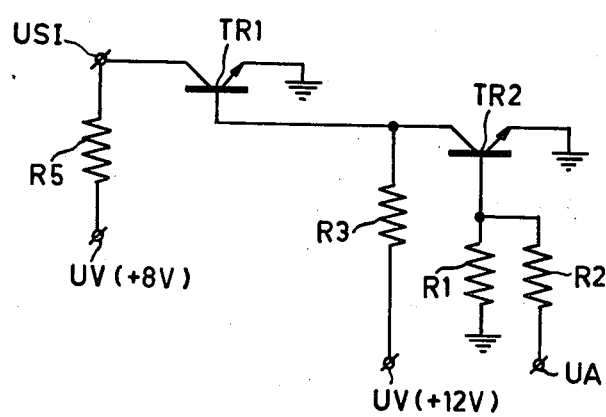
FIG. 2 shows an embodiment of a switching voltage generator for the circuit arrangement of FIG. 1.

FIG. 2 shows the switching voltage generator for the circuit arrangement of FIG. 1. It contains a transistor TR2 with a base potential divider R1-R2 and a collector resistor R3 and a second transistor TR1 with a collector resistor R5. In this case the collector denoted by USI of TR1 serves for connection to the terminal USI of FIG. 1. For small tuning voltages the transistor TR2 is cut off and the transistor TR1 is conducting. Thus this applies, for example, to a tuning voltage UA of less than 6 V. As a result the anodes of the switching diodes D3 and D4 are connected through the common coupling coil LKIII and the collector-emitter path of the transistor TR1 to ground. The cathodes of the switching diodes D3 and D4 are connected through the band coils LI, the common coupling coil LKI and the resistor R9 to ground. Due to the internal voltage threshold of 0.7 V the switching diodes D3 and D4 are blocked. As already described hereinbefore the band coils LI and LIII are thus jointly active and tuning is effected within the band I. The upper end of the resistor R9 and the anodes of the switching diodes D3 and D4 are thus connected to ground and to 0 V, respectively.

A change-over to band III must thus cause an interconnection of the switching diodes and hence a short circuit of the band coils LI. This is effected in the circuit arrangement according to the invention as follows When the values for the resistors are as follows:
R1 approximately 56 kOhm
R2 approximately 470 kOhm
R3 approximately 10 kOhm
R5 approximately 1 kOhm and when the biases UV as shown in FIG. 2, at the resistor R5 equal + 8V and at the resistor R3 equal + 12 V, the transistor TR2 is interconnected when the tuning voltage UA exceeds the value of + 6 V, that is to say, TR2 becomes conducting. This driver transistor TR2 brings the switching transistor TR1 into its cut-off state. Then a current flows from the bias voltage source of + 8 V, through the resistor R5 and the terminal USI, the common coupling coil LKIII and the two switching diodes D3 and D4 through the band coils LI and the common coupling coil LKI and the resistor R9 to ground. Thus, when the resistor R5 has a value of 1 kOhm and R9, as mentioned above, has a value of approximately 2.7 kOhm and when the bias voltage is +8 V and the pass voltages at the switching diodes D3 and D4 are approximately 0.6 V, the current through the resistor R9 is approximately 2 mA. It can then easily be calculated that the upper tap on the resistor R9 changes from 0 to 5.4 V.

As is generally known a direct current circuit is to be blocked with respect to RF voltages. To this end the capacitor C8 is provided which may have a value of approximately 1000 pF. In the same way the resistor R9 which is only essential for the direct current circuit is likewise shunted by a capacitor C9. This capacitor may likewise have a value of 1000 pF.

Figure 3:
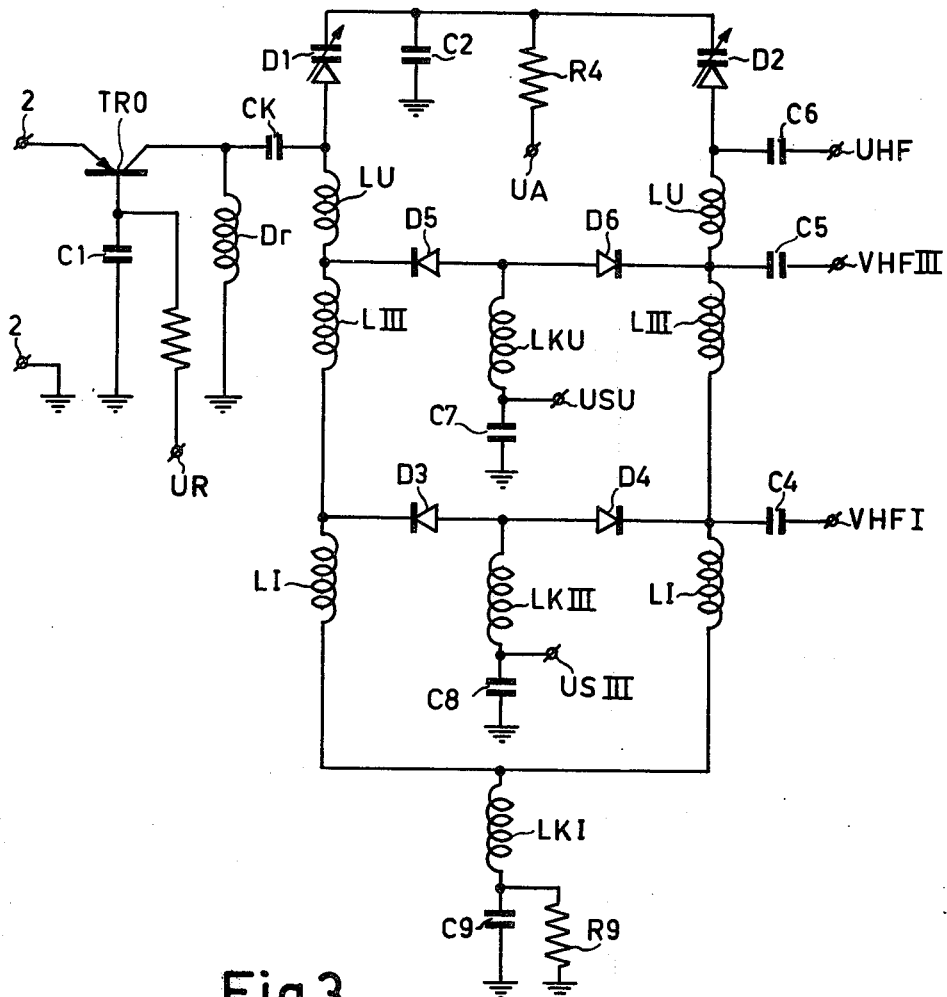
FIG. 3 shows a base circuit for a combined UHF-VHF tuner according to the invention.
Figure 4:
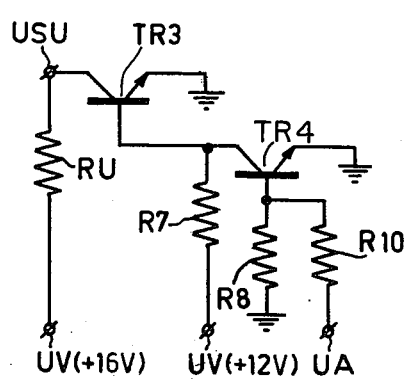
FIGS. 4 and 5 show embodiments of a switching voltage generator for the circuit arrangement according to FIG. 3.
Figure 5:
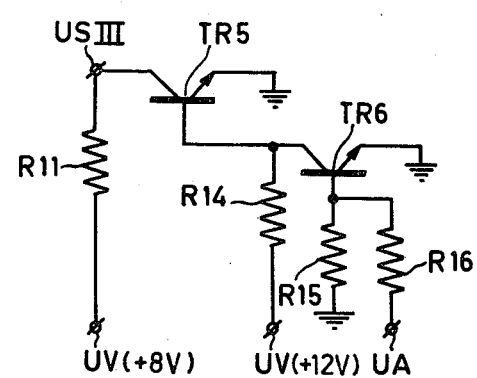

FIG. 3 shows a further elaboration of the circuit arrangement of FIG. 1 for a combined tuner for two bands in the VHF range and for a band in the UHF range. The components in FIG. 3 having the same reference numerals as in FIG. 1 have the same functions. It is evident that in FIG. 3 extra coils LU are present for the UHF range and furthermore extra switching diodes D5 and D6 which lead to a common coupling coil for the UHF range denoted by LKU and connected to ground at the junction with a capacitor C7 of approximately the order of 1000 pF. Since, however, one change-over extra must take place, two extra switching diodes D5 and D6 are provided. The associated connection points for the switching voltage generator are denoted by USU and USIII and the associated switching voltage generators are shown in FIGS. 4 and 5. In conformity with FIG. 2 these circuits according to FIG. 4 and FIG. 5 again consist of two transistors. The resistors RU and R11 each have a value of approximately 1 kOhm while the resistors R7 and R14 each have a value of 10 kOhm, the resistors R10 and R16 each approximately 470 kOhm, the resistor R8 approximately 27 kOhm, the resistor R15 approximately 56 kOhm.

While in FIG. 2 the tuning voltage was applied through R2, this is effected in FIG. 4 through the resistor R10 and in FIG. 5 through the resistor R16. Furthermore the operation is the same as in FIG. 1 and in FIG. 2, hence as follows:

Likewise as for the transistor TR1 in FIG. 2 the phase inverter stages with the driver transistors TR4 and TR6 are arranged before the switching transistors TR3 and TR5. This results in the fact that the transistors namely the switching transistors TR3 and TR5 conduct at low tuning voltages UA and are cut off at higher tuning voltages, while the switching diodes D5 and D6 having the same polarity as the switching diodes D3 and D4 are provided in the RF circuits.

The operation is as follows:

When the tuning voltage UA is lower than 6 V the driver transistors TR4 and TR6 are cut off and the switching transistors TR3 and TR5 are conducting. As a result the switching points USIII and USU and hence the anodes of all switching diodes D3, D4 and D5 and D6 are connected to ground. The cathodes of these diodes are connected to ground potential through the resistor R9 which is thus common for all diodes. All switching diodes are blocked due to the internal voltage threshold of 0.7 V. The upper end of R9 and hence the anodes of the tuning diode D1 and D2 are at 0 volt.

A change-over to VHF band III is effected when the tuning voltage assumes values of between 6 and 12 V. In fact, the driver transistor TR6 then becomes conducting with the result that the switching transistor TR5 is cut off. As already described in FIG. 2 a current may then flow to ground from the bias voltage source of + 8 V, in this case through the resistor R11 and through the switching diodes D3 and D4 via the band coils LI and via the common coupling coil LKI and the common resistor R9. Thus, when the tuning voltage UA exceeds the value of + 6 V, not only the switching diodes D3 and D4 are interconnected and consequently the band coils LI are short-circuited, but also the upper end of the resistor R9 and hence the anode voltage at the variable capacity of diodes changes to approximately 5.4 V as is shown in the graph according to FIG. 6 for the tuning voltage value UA = 6 V.

Figure 6:
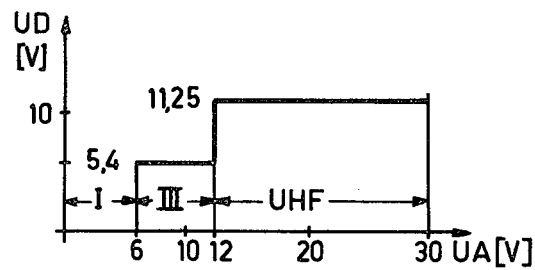
FIG. 6 shows in a graph the anode voltage of the tuning diodes dependent on the tuning voltage.

When the tuning voltage exceeds the value + 12 V, a change-over to UHF is effected. The tuning voltage at the resistor R10 according to FIG. 4 then reaches a value bringing the driver transistor TR4 into its conducting state and this causes the switching transistor TR3 to be cut off. Then a current can flow to ground from the bias source UV of + 16 V through the resistor RU, via the terminal USU, the common coupling coil LKU and the two switching diodes D5 and D6, through the band coils LIII and LI and the common coupling coil LKI and the resistor R9. As a result the voltage at the resistor R9 is additionally increased to a value of + 11.25 V as is also shown in FIG. 6. The current flowing through RU and the switching diodes D5 and D6 and through the resistor R9 can be reached with the mentioned resistances and is approximately 4.17 mA so that the above-mentioned voltage at R9 of approximately 11.25 V is obtained.

When changing over to UHF, thus in case of tuning voltages of more than 12 V, not only the switching diodes D5 and D6 are interconnected so that the band coils LIII are short-circuited, but also the voltage at the resistor R9 and consequently the anodes of the variable capacity diodes D1 and D2 are increased to 11.25 V. However, since the voltage at R9 is higher than the voltage at R11, the switching diodes D3 and D4 are blocked again. This is not essential for the operation because a short circuit of the band coils LI is also taken over by the switching diodes D5 and D6.

Figure 7:
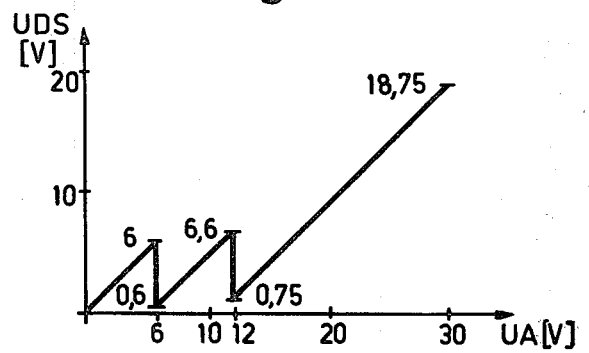
FIG. 7 shows a graph of the diode blocking voltage of the tuning diodes dependent on the tuning voltage.

The graph according to FIG. 6 shows the anode voltage of the tuning diodes D1 and D2, namely the anode voltage relative to the common reference point. The voltage directly present between the cathode and the anode of this diode is active at the variable capacity diodes D1 and D2 and this voltage may be referred to as the diode blocking voltage UDS or as the variable capacity diode voltage. This voltage which is decisive of tuning shows a completely different variation from the voltage according to FIG. 6 and this different variation is shown in FIG. 7. Whenever a new range is switched on, the active voltage decreases, hence the diode blocking voltage decreases to approximately 0 V and increases from that point onwards obtaining a kind of sawtooth voltage. This manner of conveying the voltage is the paramount point of the invention. The advantage is that the active capacitance of the variable capacity diode for each reception range is utilized in much larger change-over regions, that is to say, in the regions having the greatest steepness where the steepness is equal to the variation of the capacitance as a function of the tuning voltage.

The above-mentioned steps are described in FIGS. 1 and 3 for a bandpass filter which is provided between the input stage and the mixer stage. In the same manner the invention may alternatively be used when the filter includes only one variable capacity diode. The invention is thus also suitable for circuits which are denoted as preliminary circuit or as oscillatory circuit.

It is to be noted that coupling out of the UHF channel can be effected through the capacitor C6 which may have a value in the order of 1 pF. The mixer stage is connected to these points, for example, the connection points according to FIG. 1 for band I agree with point D according to German published patent application No. 2,116,901 and the connection point for band III according to FIG. 1 agree with point A according to German published patent application No. 2,116,901. As regards the connection points of band I, Band III in FIG. 3 there applies the same as denoted with reference to FIG. 1, but in this case there is also a UHF connection which is connected to the corresponding point according to prior German patent application No. P 2261395.

Figure 8:
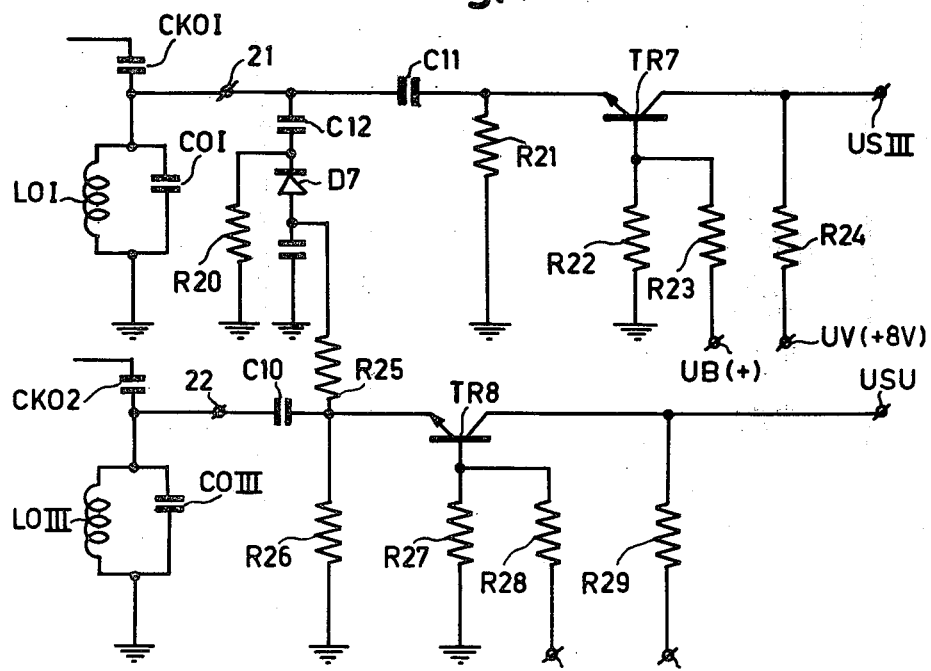
FIG. 8 shows a switching voltage generator for obtaining the switching voltage from the oscillator voltage or voltages.

Another possibility is that the switching voltages for the diodes operating as switches are derived from the oscillator voltage. Such a switching voltage generator is shown in FIG. 8. Here the known resonant circuits for the VHF range band I and the VHF range band III are provided with corresponding extra references, namely the resonant circuit for band I consisting of the coil LOI and the capacitor COI is arranged between a coupling capacitor CKO1 and the common reference point and the resonant circuit for the range III consisting of a coil LOIII and a capacitor COIII is arranged between a coupling capacitor CKO2 and the common reference point.

In the circuit arrangement according to FIG. 8 the starting point is a circuit arrangement as described in German published patent application No. 2,116,901.

For the range I coupling out is effected at 21, for the range or the band III it is effected at 22. The components have the following technical details:

transistor TR7 and TR8, for example, of the type BC238.

capacitor C10 approximately 1 pF, C11 approximately 2 pF, C12 approximately 2 pF and the resistors R10 approximately 10 kOhm, R21 approximately 3.9 kOhm, R22 approximately 27 kOhm, R23 approximately 470 kOhm, R24 approximately 10 kOhm, R25 approximately 5.7 kOhm, R26 approximately 5.6 kOhm, R27 approximately 27 kOhm, R28 approximately 470 kOhm, R29 approximately 100 kOhm. The diode D7 may be, for example, of the type OA 90. The outputs of the circuit arrangement are denoted by USIII and USU and are connected to the corresponding connections in FIG. 2.

The operation of the circuit arrangement according to FIG. 8 is as follows:

In case of oscillation in the UHF range the resonant circuits LOI and LOIII are free from voltage. The transistors TR7 and TR8 do not convey current. The base electrodes of these transistors receive a positive voltage through the potential divider R22 – R23 and R27 – R28, but these base voltages are insufficient to surpass the internal base emitter threshold value of the transistors. Since the transistors do not convey current, their collector voltages are high (USIII = + 8 V, USU = + 16 V).

In case of oscillation in band III the emitter base diode of transistor TR8 operates as a rectifier for the oscillator voltage present across the resonant circuit LOIII. The DC component flowing through R29, TR8 and R26 causes the voltage at the terminal USU to decrease to approximately 0 V. In case of oscillation in band I the oscillator voltage at the circuit LOI is rectified in the same way by the transistor TR7 so that the voltage at the terminal USIII is reduced to approximately 0 V. In addition a rectification by diode D7 is effected. The resultant direct current flows through R29, TR8, R25, D7 and R20 while the output voltage USU is also low.

For the transistors used the type BC 238 may be used, type BB 105 for the variable capacity diodes, type OA 91 for diode D7 and type BA 182 for switching diodes D3, D4, D5 and D6.

What is claimed is:

1. A circuit arrangement for tuning and range for band switching of an RF resonant circuit, comprising a variable capacity diode which can be controlled by a tuning voltage for tuning the resonant circuit, a switching diode controlled by a switching voltage for short-circuiting part of the resonant circuit inductor for range switching and a switching voltage generator controlled by the tuning voltage for generating the switching voltage for the switching diode, characterized in that a reset voltage derived from the switching voltage is applied in addition to the tuning voltage to the variable capacity diode, which reset voltage resets the voltage across the variable capacity diode to approximately 0 V when a new range is switched on.

2. A circuit arrangement as claimed in claim 1 in which the variable capacity diode and the switching diode each have a first electrode and a second electrode and the tuning voltage is applied to the first electrode of the variable capacity diode and the switching voltage to the first electrode of the switching diode, characterized by a resistor connected with respect to direct current to the second electrode of the switching diode through which electrode the reset voltage is adjusted and by a connection connected with respect to direct current between said resistor and the second electrode of the variable capacity diode through which connection the reset voltage is applied to the variable capacity diode.

3. A circuit arrangement as claimed in claim 1 for tuning and switching over an RF resonant circuit over at least three frequency ranges, characterized by a switching voltage generator for generating a first switching voltage for a first switching diode switching the RF resonant circuit from a first into a second frequency range and for generating a second switching voltage for a second switching diode switching the RF resonant circuit from a second into a third frequency range, characterized in that a reset voltage derived from the two switching voltages is applied to the variable capacity diode which reset voltage reduces the voltage across the variable capacity diode to substantially 0 V both when changing over from the first to the second frequency range and when changing over from the second to the third frequency range.

4. A circuit arrangement as claimed in claim 1, for use in a tuner with an oscillator controlled by the tuning voltage, characterized by a switching voltage generator controlled by said oscillator and comprising one or more rectifiers.

5. A circuit arrangement for tuning and range switching of an RF resonant circuit, comprising a variable capacity diode means which can be controlled by a tuning voltage for tuning the resonant circuit, a switching diode means controlled by a switching voltage for short-circuiting part of the resonant circuit inductor for range switching, a switching voltage generator means controlled by the tuning voltage for generating the switching voltage for the switching diode, and means for deriving a reset voltage from the switching voltage and for applying said reset voltage to the variable capacity diode for resetting the voltage across the variable capacity diode to approximately zero volts when the range is switched.

* * * * *